(12) United States Patent
Embar et al.

(10) Patent No.: US 9,209,754 B2
(45) Date of Patent: Dec. 8, 2015

(54) AMPLIFIER WITH ADJUSTABLE LOAD

(71) Applicants: Ramanujam Srinidhi Embar, Chandler, AZ (US); Joseph Staudinger, Gilbert, AZ (US); Geoffrey G. Tucker, Tempe, AZ (US)

(72) Inventors: Ramanujam Srinidhi Embar, Chandler, AZ (US); Joseph Staudinger, Gilbert, AZ (US); Geoffrey G. Tucker, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 14/095,814

(22) Filed: Dec. 3, 2013

(65) Prior Publication Data

US 2015/0155838 A1    Jun. 4, 2015

(51) Int. Cl.
*H03F 3/68* (2006.01)
*H03F 1/56* (2006.01)
*H03F 3/21* (2006.01)
*H03F 3/19* (2006.01)

(52) U.S. Cl.
CPC .. *H03F 1/56* (2013.01); *H03F 3/19* (2013.01); *H03F 3/211* (2013.01); *H03F 2200/451* (2013.01); *H03F 2203/21139* (2013.01); *H03F 2203/21142* (2013.01)

(58) Field of Classification Search
USPC .................. 330/295, 124 R, 84, 286, 53, 305
See application file for complete search history.

(56) References Cited

U.S. PATENT DOCUMENTS 8,576,010 B2 * 11/2013 Yanduru et al. ............... 330/295
8,611,834 B2 * 12/2013 Harris et al. ................ 455/114.1

FOREIGN PATENT DOCUMENTS

EP          2413498 A1     2/2012

OTHER PUBLICATIONS

Sarkeshi, M., Ooi Ban Leong, van Roermund, 'A Novel Doherty Amplifier for Enhanced Load Modulation and Higher Bandwidth', A Microwave Symposium Digest, pp. 763-766, IEEE MTT-S 2008.
Richard B. Whatley, Zhen Zhou, and Kathleen L. Melde, 'Reconfigurable RF Impedance Tuner for Match Control in Broadband Wireless Devices', IEEE Transactions on Antennas and Propagation, vol. 54, No. 2, Feb. 2006.
Papapolymerou, J., Lange, K.L., Goldsmith, C.L., Malczewski, Andrew, Kleber, J, 'Reconfigurable Double-Stub Tuners Using MEMS Switches for Intelligent RF Front-Ends', Microwave Theory and Techniques, IEEE Transactions on vol. 51, Issue: 1, pp. 271-278, 2003.

* cited by examiner

*Primary Examiner* — Hieu Nguyen
(74) *Attorney, Agent, or Firm* — Quarles & Brady LLP

(57) ABSTRACT

A device includes a Doherty amplifier having a carrier path and a peaking path. The Doherty amplifier includes a carrier amplifier configured to amplify a signal received from the carrier path and a peaking amplifier configured to amplify a signal received from the peaking path. The device includes a variable impedance coupled to an output of the Doherty amplifier, and a controller configured to set the variable impedance to a first impedance when an output power level of the Doherty amplifier is less than a threshold and to a second impedance when the output power level of the Doherty amplifier is above the threshold.

14 Claims, 7 Drawing Sheets

AMPLIFIER WITH ADJUSTABLE LOAD

FIELD OF THE INVENTION

Embodiments of the inventive subject matter relate to an amplifier and more specifically to an amplifier having an adjustable load for improved performance.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

During operation, at low input power levels, the carrier amplification path is conductive, while the peaking path is non-conductive. As the magnitude of an input signal increases, however, eventually the peaking path will become conductive. At this time, the operation of the peaking amplification path affects the load observed by the amplifier's carrier path. This change in apparent load reduces the efficiency of the amplifier's carrier path as well as the overall efficiency of the amplifier.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In overview, the present disclosure describes embodiments of the inventive subject matter that relate to an amplifier and more specifically to an amplifier having an adjustable load for improved performance.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers—a carrier or main amplifier, and a peaking amplifier. In a symmetric Doherty amplifier, the carrier and peaking amplifiers are the same size. Asymmetric Doherty amplifiers employ a peaking amplifier that is larger than the carrier amplifier offer the potential for additional efficiency improvements.

In a Doherty amplifier, an input signal is split at an input or power splitter between the carrier and peaking amplification path or circuit. The split signals are then separately amplified by the carrier and peaking amplifiers of the Doherty amplifier and combined at an output stage.

Figure 1:
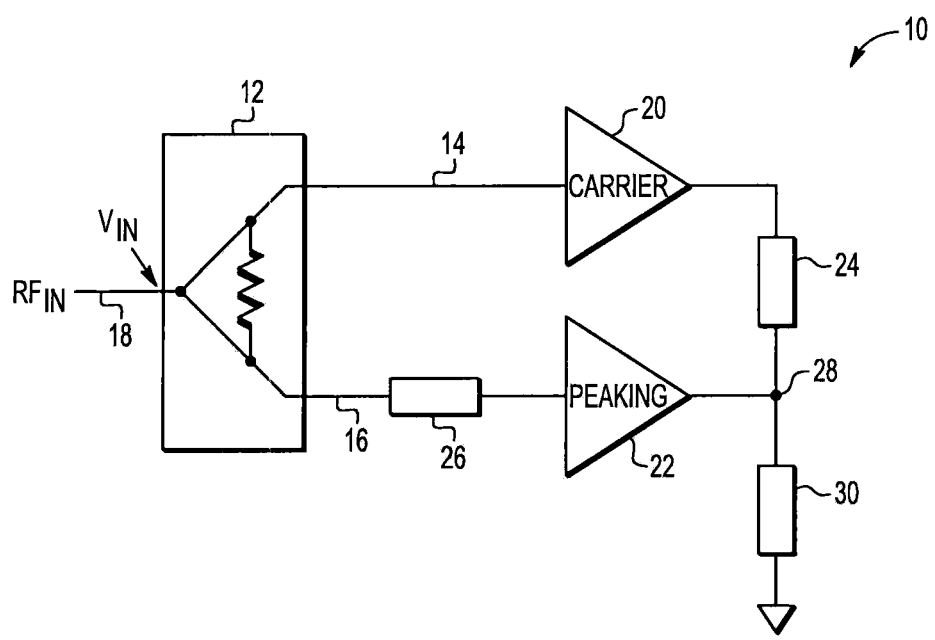
FIG. 1 shows a conventional Doherty amplifier lineup including a main or carrier path and a peaking path.

FIG. 1 shows a conventional Doherty amplifier lineup 10 including a main or carrier path and a peaking path. In FIG. 1 as shown, a power splitter 12 is coupled to a main or carrier path 14 and a peaking path 16 of Doherty amplifier 10. The power splitter 12 is configured to divide an input signal 18 (e.g., radio frequency in (RFIN)) into multiple signals that are each transmitted along different amplification paths. In FIG. 1, the power splitter 12 generates two output signals.

In one implementation, the power splitter 12 can include a power divider with an input for receiving an input radio frequency signal, and first and second divider outputs. When connected to a symmetrical Doherty amplifier, the power splitter 12 may divide or split an input signal received at the input 18 into two signals that are very similar with, in some embodiments, equal power. In other cases, though, the power splitter 12 may output signals having unequal power.

The outputs of the power splitter 12 are connected to main or carrier amplifier 20 and peaking amplifier 22. Carrier amplifier 20 is coupled via a matching network or circuit (not illustrated) to a first output of power splitter 12. Peaking amplifier 22 is coupled via a matching network or circuit (not illustrated) to a second output of power splitter 12. As will be appreciated by those of ordinary skill based on the description herein, the carrier and peaking amplifiers 20 and 22 may include one or more stages of relatively low power level amplification and relatively high power level amplification.

An impedance inverter or a λ/4 transmission line phase shift element 24 is connected between the output of carrier amplifier 20 and a summing or output node 28, and the output of the peaking amplifier 22 also is coupled to the summing node 28. The phase shift introduced by element 24 is, in some implementations, compensated by a 90 degree relative phase shift present on path 16 introduced by phase shift element 26. Alternatively, amplifier 10 may have an "inverted Doherty" configuration. In such a configuration, the impedance inverter or λ/4 line phase shift element 24 is connected between the output of peaking amplifier 22 and the summing node, rather than being connected between the output of carrier amplifier 20 and the summing node.

The outputs of carrier amplifier 20 and peaking amplifier 22 are combined at combiner node 28. An impedance network, represented by element 30 operates to present the proper load impedances to each of carrier amplifier 20 and peaking amplifier 22. In a real-world implementation, element 30 may be replaced by a suitably configured transmission line or impedance transformer and output network, where the transmission line or impedance transformer has an impedance selected to match the impedance of amplifier 10 to the desired load.

Amplifier 10 is configured so that the carrier amplifier 20 provides the amplification for lower level input signals, and both amplifiers 20 and 22 operate in combination to provide the amplification for high input level signals. In one implementation, the carrier amplifier 20 is configured to amplify a signal received from the main path 14, while the peaking amplifier 22 is configured to amplify a signal received from the peaking path 16 only when the input signal to the amplifier exceeds a predetermined threshold (transition point α).

This may be accomplished, for example, by biasing the carrier amplifier 20, such that the carrier amplifier 20 operates in a class AB mode, and biasing the peaking amplifier 22 such that the peaking amplifier 22 operates in a class C mode.

The Doherty amplifier 10 architecture depicted in FIG. 1 is widely used in communication systems due to the architecture's capability to deliver high efficiency over an extended input signal range. The architecture can also linearize well using Digital Pre-Distortion (DPD) techniques.

In a conventional Doherty amplifier, at relatively low input signal levels, peaking amplifier 22 is non-conductive and presents a high impedance to the remainder of the amplifier 10 circuit. As a result, carrier amplifier 20 solely transmits power to a load connected to amplifier 10. Generally, the load is configured so that at a first output power level, referred to herein as a back-off level, at or above transition point α, carrier amplifier 20 reaches a voltage saturation condition thereby delivering maximum efficiency. The back-off level at which carrier amplifier 20 saturates can depend on the combiner load. For example, in the case of a symmetrical 2-way Doherty, maximum efficiency point may be achieved at a 6 dB back-off from a maximum output level. To realize a Doherty amplifier where transition point α is less than 0.5 (i.e., more than 6 dB back-off) an asymmetrical 2-way Doherty architecture may be used, which can incorporate lower combiner load and a higher-power peaking sub-amplifier.

As the input signal level increases above the back-off level, peaking amplifier 22 will eventually begin to conduct, thereby contributing to the total output of amplifier 10. But peaking amplifier 22's injection of current into combining node 28 causes carrier amplifier 20 to be dynamically load modulated and, consequently, carrier amplifier 20 may produce more power while remaining in voltage saturation. The efficiency of amplifier 10 is reduced at input signal levels above the back-off input level since peaking amplifier 22 is not saturated and exhibits low efficiency, which lowers the overall efficiency of amplifier 10. Note that the efficiency of amplifier 10 is a composite of both carrier and peaking amplifiers 20 and 22. Above transition point α, carrier amplifier 20 operates in voltage saturation and can be relatively efficient. Peaking amplifier 22 begins contributing power at when amplifier 10 output is just above the back-off level but can be inefficient—the efficiency of peaking amplifier 22 increases with increasing drive and reaches a maximum efficiency at 0 dB back-off.

Figure 2:
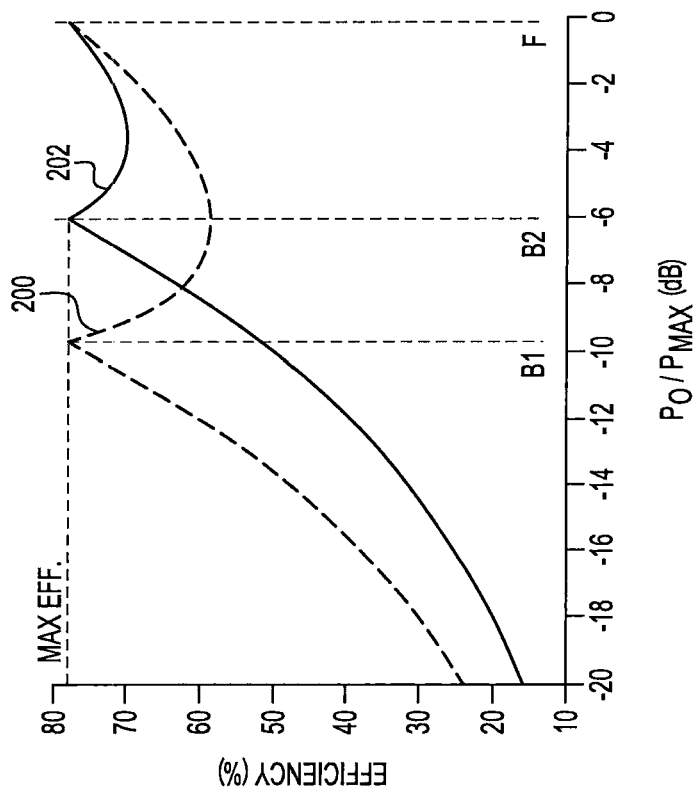
FIG. 2 is a graph comparing the efficiency of an amplifier versus the output power of the amplifier.

To illustrate, FIG. 2 is a graph comparing the efficiency of an amplifier in percent (vertical axis) versus the output power of the amplifier (horizontal axis). The output power is measured in decibels (dB) relative to a maximum power, $P_{max}$. In FIG. 2, line 200 represents the efficiency of an asymmetrical Doherty amplifier, while line 202 represents the efficiency of a symmetrical Doherty amplifier. In FIG. 2, the output power indicated by the dashed line B1 represents the back-off power level of the asymmetrical amplifier, while the dashed line B2 represents the back-off power level of the symmetrical amplifier.

As illustrated by FIG. 2, as output power increases, the efficiency of each amplifier (asymmetrical amplifier 200 and symmetrical amplifier 202) increases up to a maximum value at that amplifier's back-off power level. However, as the output power exceeds the back-off power level, the efficiency of amplifier 10 can be reduced due to the operation of that amplifier's peaking amplifier, as discussed above (note that carrier amplifier 20 can remain relatively efficient between back-off levels B1 and B2 and zero output, whereas peaking amplifier 22 can be inefficient at back-off power levels B1 and B2, while becoming more efficient as its output approaches 0 dB). This reduction of efficiency is at least partly attributable to the reduced load resistance observed by the carrier amplifier when the peaking amplifier begins to conduct, and that the peaking amplifier is not operating in voltage saturation.

Figure 3:
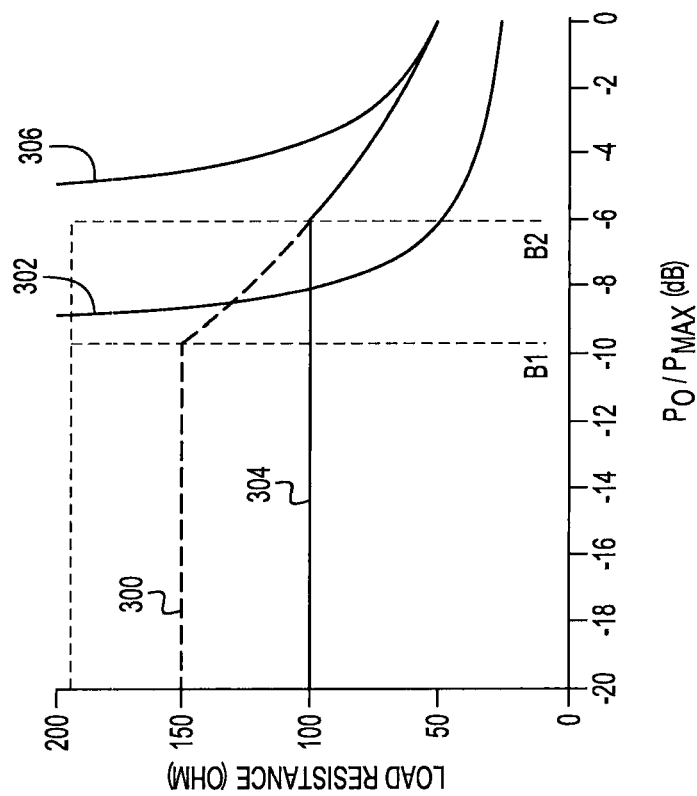
FIG. 3 is a graph depicting the load resistance observed by each of the carrier amplifier and peaking amplifier of symmetrical and asymetrical amplifiers.

FIG. 3 is a graph depicting the load resistance (or impedance) observed by each of the carrier amplifier and peaking amplifier of the symmetrical and asymetrical amplifiers of FIG. 2. In FIG. 3, the vertical axis represents the load resistance, while the horizontal axis represents output power (dB) (relative to a max power, $P_{max}$). The units in the horizontal axis of FIG. 3 are the same of those in the horizontal axis of FIG. 2. Lines 300 and 304 represent the load resistance observed by the carrier amplifiers of the asymmetrical Doherty amplifier and symmetrical Doherty amplifier, respectively. Lines 302 and 306 represent the load resistance observed by the peaking amplifiers of the asymmetrical Doherty amplifier and symmetrical Doherty amplifier, respectively.

As seen in FIG. 3, for the asymmetrical Doherty amplifier, as the output power begins to exceed the amplifiers back-off power level (B1), the load resistance observed by the carrier amplifier (line 300) begins to drop. At about the same time, as the peaking amplifier begins conducting, the load resistance observed by the peaking amplifier (line 302) also begins to drop from a maximum value.

Similarly, for the symmetrical Doherty amplifier, as the output power begins to exceed the amplifiers back-off power level (B2), the load resistance observed by the carrier amplifier (line 304) begins to drop. At about the same time, as the peaking amplifier begins conducting, the load resistance observed by the peaking amplifier (line 306) also begins to drop from a maximum value.

As described above, the reduction in load resistance observed by the carrier amplifier when the peaking amplifier begins to conduct and is not operating in voltage saturation in either the asymmetrical or symmetrical Doherty amplifiers reduces the overall efficiency of the amplifier.

Figure 4:
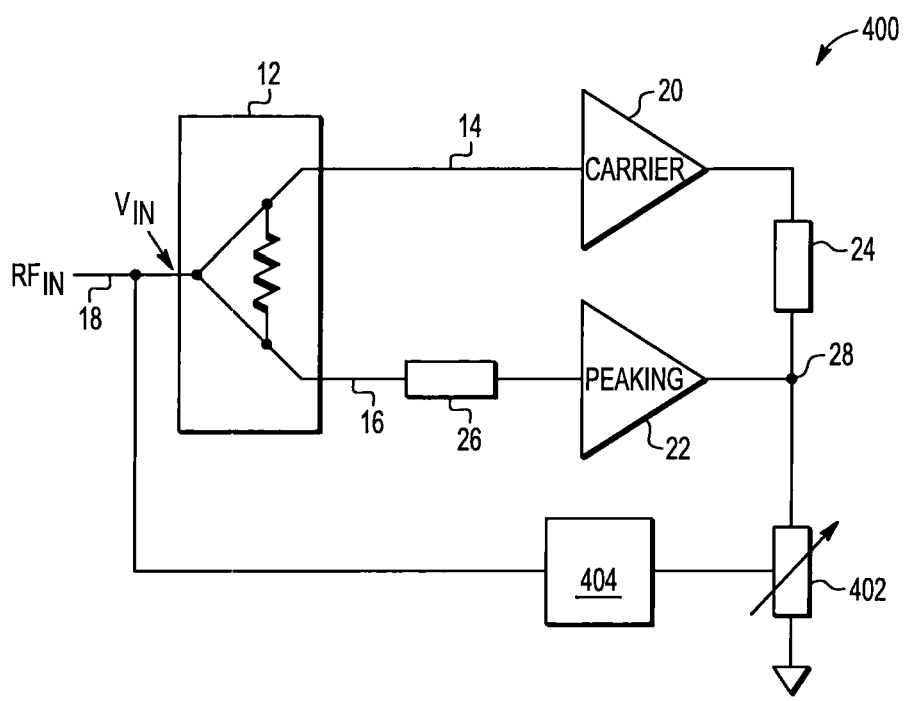
FIG. 4 shows the amplifier of FIG. 1 modified to incorporate a variable load resistance.

Accordingly, in the present amplifier, the load impedance at the amplifier's combiner node is modulated as a function of the amplifier's input signal power level. As the input signal level approaches a level resulting in an output signal at the amplifier's back-off power level, the load impedance can be modulated to provide that the carrier amplifier remains in saturation even as the amplifier's output power level increases. Such an amplifier is illustrated in FIG. 4. FIG. 4 shows the amplifier of FIG. 1 modified to incorporate a variable load resistance 402.

The impedance of variable impedance 402 can be controlled by controller 404. Controller 404 is also configured to measure a magnitude of the input signal $RF_{IN}$ to the amplifier 400. Based upon a magnitude of the envelope of the input signal to amplifier 400 (e.g., the peak envelope voltage, the average envelope voltage, the peak envelope power, the average envelope power, or some other power or voltage measurement with respect to the input signal), controller 404 adjusts the impedance of variable impedance 402 to provide for a more efficient operation of amplifier 400. In other embodiments, controller 404 may instead measure the output power level of amplifier 400 to select an appropriate impedance for variable impedance 402.

In one implementation, a single back-off power level is defined for amplifier 400. When the input signal causes the output of amplifier 400 to operate below that back-off level, controller 404 may set the variable impedance 402 to a first value. Conversely, when the input signal causes the output of amplifier 400 to be above that back-off level, controller 404 may set the variable impedance 402 to a second value. The desired impedance of variable impedance 402 ($R_o$) at a particular back-off level $Po/P_{max}$ expressed in dB can be related as $Po/P_{max} = 20 \log(R_o/Z_o)$ where $Z_o$ is the characteristic impedance 24. Alternately, a is equal to $R_o/Z_o$ where a is the transition point at which carrier amplifier 20 reaches a voltage saturation condition.

Figure 5C:
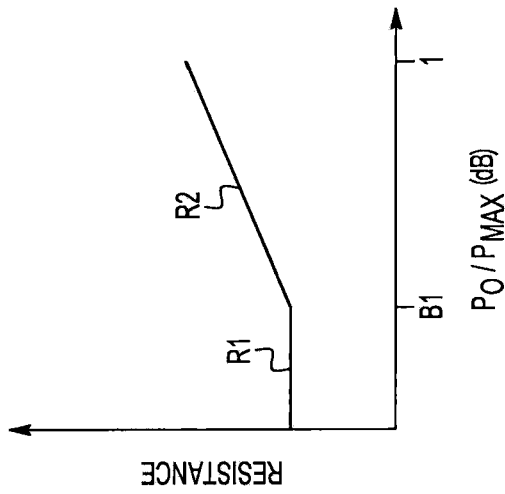
FIGS. 5A-5C are graphs illustrating how the impedance of a variable impedance may be adjusted based upon a magnitude of an envelope of an input signal detected by a controller.
Figure 5B:
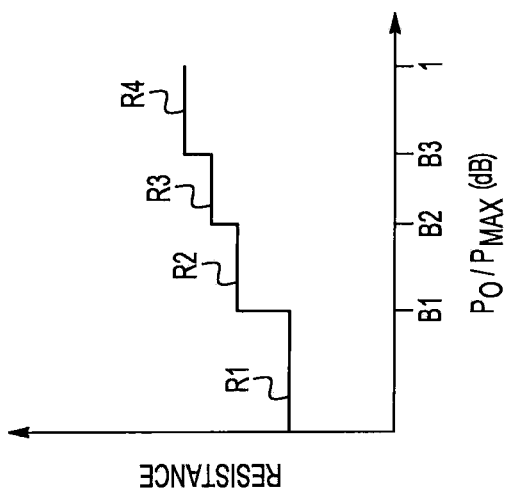
Figure 5A:
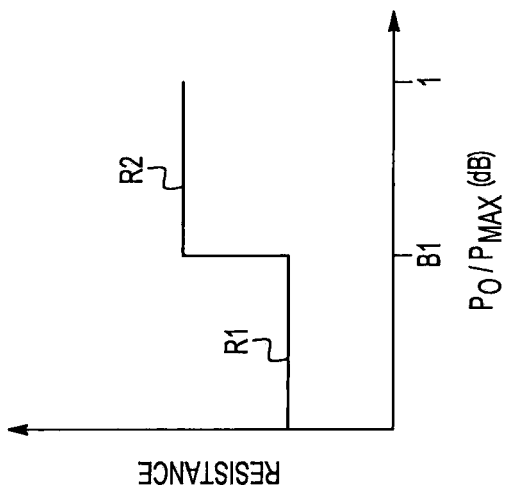

To illustrate, FIG. 5A is a graph illustrating how the impedance of variable impedance 402 may be adjusted based upon the magnitude of the envelope of the input signal detected by controller 404 of FIG. 4. In FIG. 5A, the vertical axis represents the resistance of variable impedance 402 and the horizontal axis represents the output power level of the amplifier (relative to a max power, $P_{max}$). A single back-off level B1 is defined. When controller 404 detects an input signal that will result in the amplifier exhibiting an output power level falling below B1, controller 404 sets the resistance of variable impedance 402 to a first resistance, R1. But when controller 404 detects an input signal that will result in the amplifier exhibiting an output power level falling above B1, controller 404 sets the resistance of variable impedance 402 to a second resistance, R2. Both R1 and R2 are selected to provide that the carrier amplifier is fully saturated at output power levels above and below B1.

In other implementations, two or more back-off levels may be defined for amplifier 400, where each back-off level is associated with a different resistance of variable impedance 402.

To illustrate, FIG. 5B is a graph illustrating how the impedance of variable impedance 402 may be adjusted based upon the magnitude of the envelope of the input signal detected by controller 404 of FIG. 4. In FIG. 5B, the vertical axis represents the resistance of variable impedance 402 and the horizontal axis represents the output power level of the amplifier (relative to a max power, $P_{max}$). Back-off levels B1, B2, and B3 are defined. When controller 404 detects an input signal that will result in the amplifier exhibiting an output power level falling below B1, controller 404 sets the resistance of variable impedance 402 to a first resistance, R1. When controller 404 detects an input signal that will result in the amplifier exhibiting an output power level falling between B1 and B2, controller 404 sets the resistance of variable impedance 402 to a second resistance, R2. When controller 404 detects an input signal that will result in the amplifier exhibiting an output power level falling between B2 and B3, controller 404 sets the resistance of variable impedance 402 to a third resistance, R3. When controller 404 detects an input signal that will result in the amplifier exhibiting an output power level falling above B4, controller 404 sets the resistance of variable impedance 402 to a fourth resistance, R4. R1, R2, R3, and R4 are selected to provide that the carrier amplifier is fully saturated at the output power levels defined by back-off levels B1, B2, and B3.

In some cases, variable impedance 402 may be continuously adjustable through a large number of impedance states. In that case, controller 404 may be configured to map a particular output power level of amplifier 400 to a particular impedance of variable impedance 402.

To illustrate, FIG. 5C is a graph illustrating how the impedance of variable impedance 402 may be adjusted based upon the magnitude of the envelope of the input signal detected by controller 404 of FIG. 4. In FIG. 5C, the vertical axis represents the resistance of variable impedance 402 and the horizontal axis represents the output power level of the amplifier (relative to a max power, $P_{max}$). Back-off level B1 is defined. When controller 404 detects an input signal that will result in the amplifier exhibiting an output power level falling below B1, controller 404 sets the resistance of variable impedance 402 to a first resistance, R1. But when controller 404 detects an input signal that will result in the amplifier exhibiting an output power level falling above B1, controller 404 sets the resistance of variable impedance 402 to a value determined by the slope of line R2. Both R1 and the slope of line R2 are selected to provide that the carrier amplifier is fully saturated at output power levels above and below B1.

In various other implementations, any number of back-off levels may be defined within controller 404. In some cases, an equation or look-up table may be used to determine any appropriate resistance for variable impedance 402. Although FIG. 5C shows a straight line defining the resistance of variable impedance 402 any lines or curves, whether continuous or not, may be used to define the resistance of variable impedance.

In determining how to adjust the impedance of variable impedance 402, the expression Po/Pomax=20 log [R0/Z0] provides the relationship between back-off level and the impedance of variable impedance 402 (RO), where Z0 is the characteristic impedance of the inverter 24. Based on this expression, which could define the slope of R2 in FIG. 5C, for example, an equation or look-up table may be used to determine any appropriate resistance for variable impedance 402. An appropriate number of back-off levels and the step size of RO is generally application-specific and depends upon the location and the traffic at a given point of time.

Figure 6:
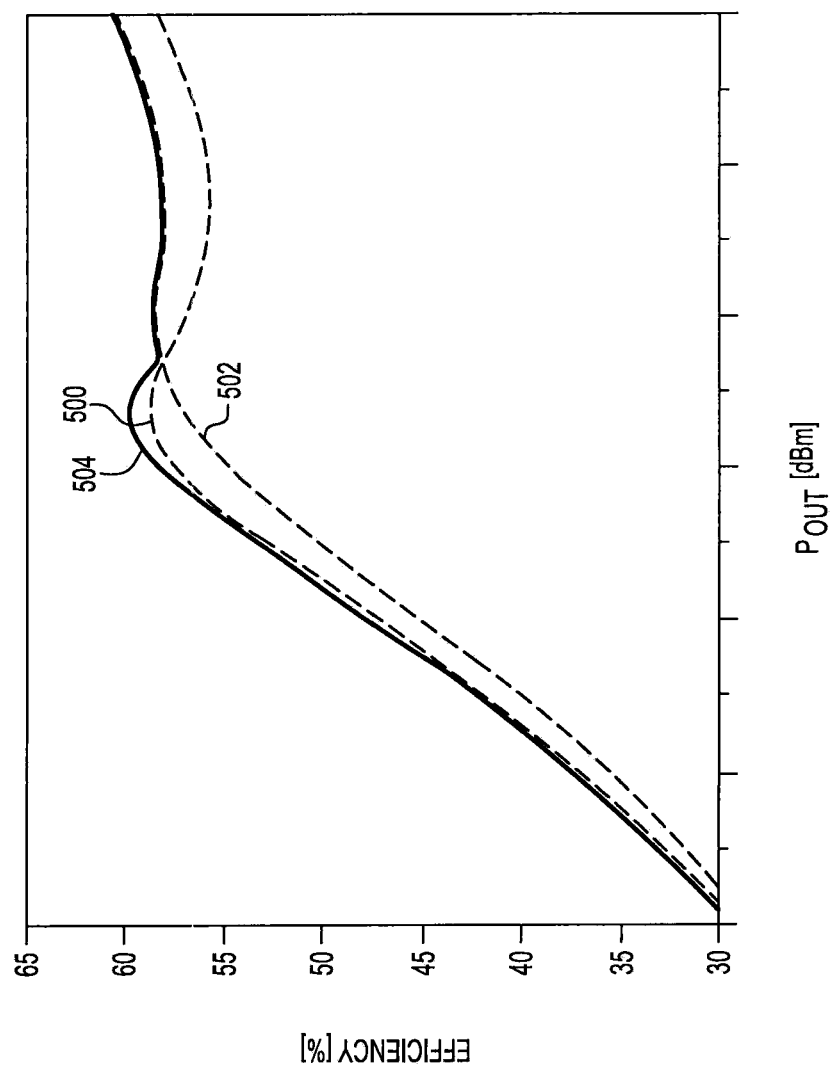
FIG. 6 is a graph comparing the efficiency versus output power of a number of amplifiers.

Using this approach, it can be possible to improve the efficiency of amplifier 400 by adjusting the amplifier's load to provide that carrier amplifier 20 remains in saturation, even at power levels above back-off level of amplifier 400. FIG. 6, for example, is a graph comparing the efficiency versus output power of a number of amplifiers. Line 500 represents the efficiency of a conventional asymmetrical Doherty amplifier with a load modulation of 3, while line 502 shows the efficiency of a conventional symmetrical Doherty amplifier with a load modulation of 2.5. These curves are similar to those shown in FIG. 2. Line 504, however, shows the efficiency of the present amplifier device in which the load resistance is variable. As shown, line 504 demonstrates improved efficiency of the over both the symmetrical and asymmetrical Doherty amplifier configurations.

The example adjustments to variable impedance 402 demonstrated in FIGS. 5A, 5B, and 5C have been described in terms of adjusting only the resistance of impedance 402. In many amplifier implementations, however, the modification of variable impedance 402 will, in fact, involve the modification of the impedance of variable impedance 402 in a manner calling for the adjustment of both the resistance and reactance of variable impedance 402. When the amplifier is connected to an external load, for example, the amplifier may be connected to the external load through an impedance transformer. By modifying the impedance of that impedance transformer, it can be possible to adjust the impedance at the combiner node of the amplifier to provide that the amplifier's carrier amplifier remains in saturation.

Figure 7:
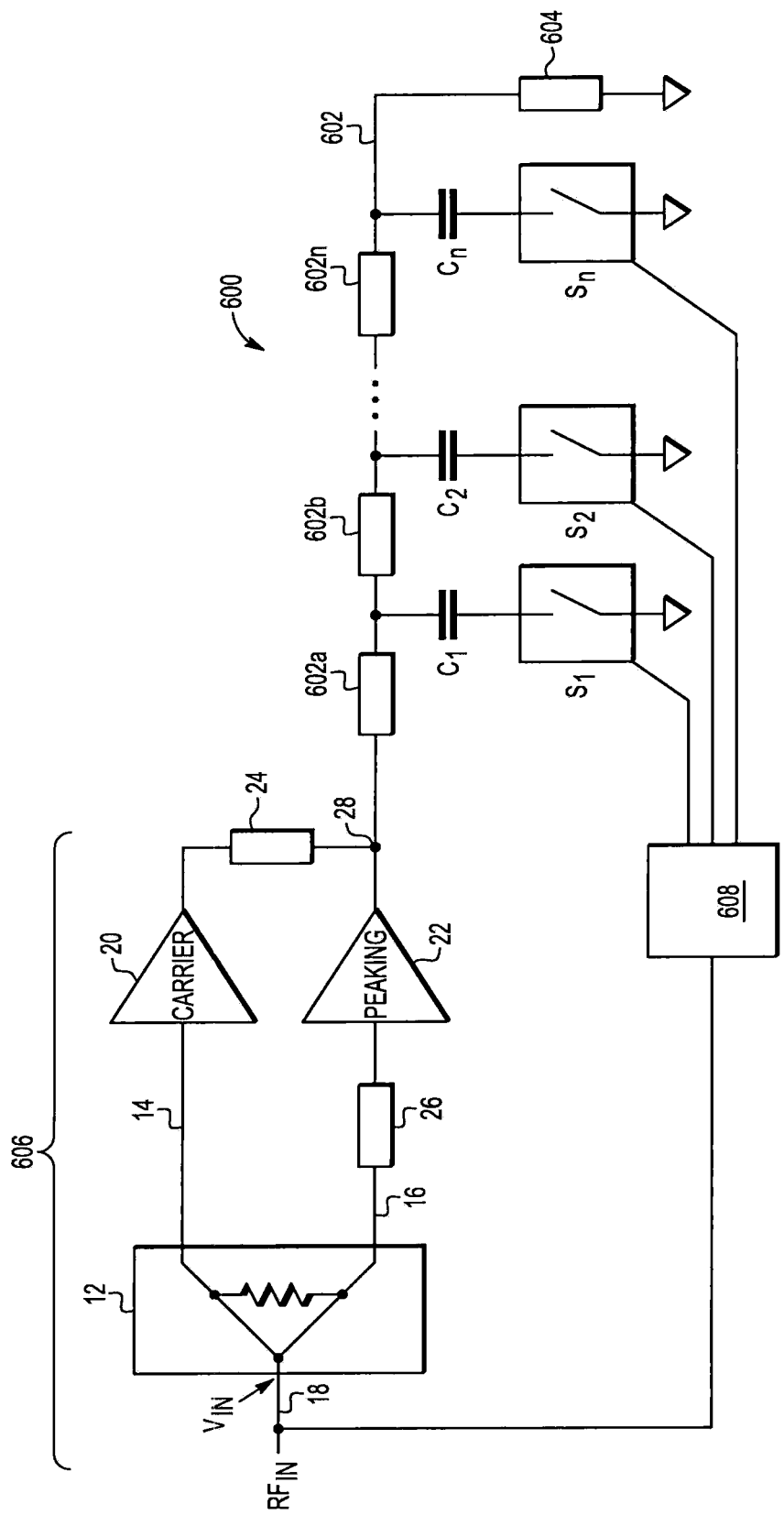
FIG. 7 is a diagram illustrating an amplifier incorporating a variable impedance transformer connected between the amplifier's combiner node and a load.

FIG. 7 is a diagram illustrating an amplifier incorporating a variable impedance transformer connected between the amplifier's combiner node and a load. By adjusting the impedance of impedance transformer 600, it is possible to vary the impedance at the amplifier's combiner node 28 and thereby control the operation of carrier amplifier 20 as described herein.

Impedance transformer 600 includes a number of lengths of transmission line 602a, 602b, . . . 602n. Transmission line 602 is connected to combiner node 28 of amplifier 606 to load 604. In general, at any instant or back-off level, the combination of the transmission line 602, having a specific length, with the capacitors $C_1, C_2 \ldots$ and/or $C_n$ and the corresponding switch $S_1, S_2, \ldots$ or $S_n$ will deliver the preferred impedance when the amplifier is operating at output power levels below the amplifier's back-off level.

As shown in FIG. 7, a number of additional capacitors ($C_1, C_2, \ldots C_n$) are connected between transmission line 602 and constant (e.g., ground) voltage terminals through a number of switches ($S_1, S_2, S_n$). Each one of switches $S_1, S_2, \ldots S_n$ are connected to controller 608, which is configured to supply a control signal to each one of switches $S_1, S_2, \ldots S_n$ to selectively close or open one or more of switches $S_1, S_2, \ldots S_n$.

When switches $S_1, S_2, \ldots S_n$ are open, capacitors $C_1, C_2, \ldots C_n$ are effectively removed from the circuit and the impedance of impedance transformer 600 is solely determined by the impedances of the lengths of transmission line 602. However, by closing one or more of switches $S_1, S_2, \ldots S_n$, the corresponding capacitor can be connected to transmission line 602, thereby modifying the impedance of transmission line 602.

In designing impedance transformer 600, the combination of line elements 602, capacitors and switches are selected to deliver specific RO impedance at node 28. In general, the number of capacitors, as well as their individual capacitances, will be selected according to design choices in view of the desired use of the amplifier device.

During operation of the amplifier, controller 608 monitors the output power of the connected amplifier. This may be achieved, as discussed above, by monitoring the input signal to amplifier 606 and inferring the output power of the amplifier. Depending upon a magnitude of that output power or input signal to the amplifier, the combination of the transmission line 602, having a specific length, with the capacitors $C_1, C_2 \ldots$ and/or $C_n$, and the corresponding switch $S_1, S_2, \ldots$ or $S_n$ will deliver the preferred impedance in view of the operating output power level of the amplifier. When implementing this approach, controller 608 may be configured to be capable of switching switches $S_1, S_2, \ldots S_n$ on and off at a rate that is at least equal to a frequency of the envelope of the amplifier's input signal, or faster. For example, Table 1, below, provides an example switching matrix that may be utilized by a controller to modulate the impedance at node 28 using impedance transformer 600 based upon the output power of amplifier 606.

TABLE 1

| Power (P) | $S_1$ | $S_2$ | . . . | $S_n$ |
|---|---|---|---|---|
| $P < B_1$ | On | Off | — | Off |
| $B_1 \leq P < B_2$ | Off | On | — | Off |
| — | — | — | — | Off |
| $B_n \leq P$ | Off | Off | Off | On |

For output power levels below first back-off level B1, controller 608 is configured to turn on switch $S_1$, thereby connecting capacitor $C_1$ to transmission line 602. As the output power continues to increase and exceed the first back-off level B1, but is less than a second back-off level, the controller may be configured to turn off switch $S_1$, and turn on switch $S_2$, thereby connecting capacitor $C_2$ to transmission line 602 increasing the impedance of impedance transformer 600. This procedure continues, depending upon the number of capacitors, corresponding switches, and defined back-off levels.

In this manner, the impedance of impedance transformer 600 can be adjusted or modulated based upon the output power level of the amplifier to control an operation of the amplifier's carrier amplifier.

Figure 8:
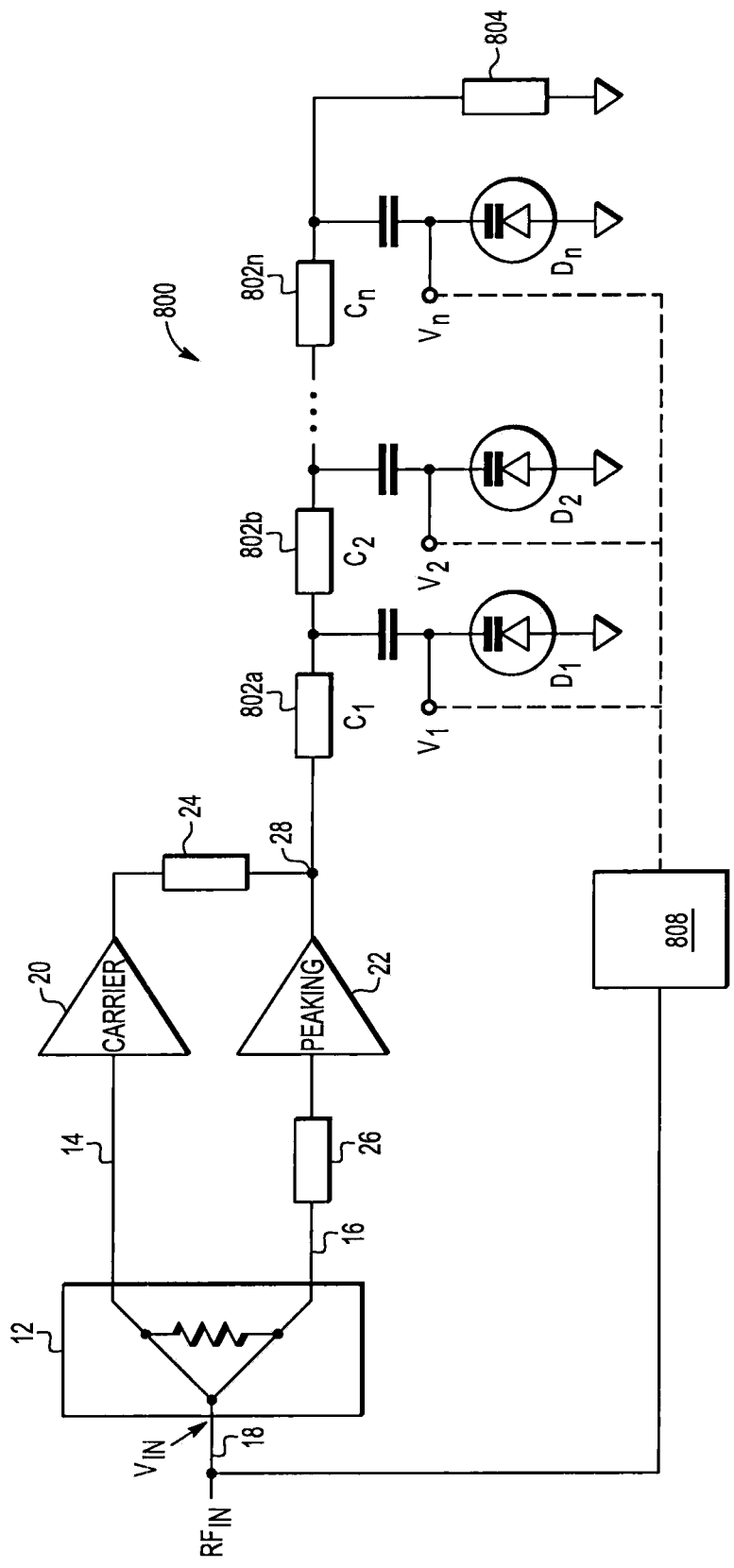
FIG. 8 is a diagram illustrating an amplifier incorporating an alternative variable impedance transformer connected between the amplifier's combiner node and a load.

FIG. 8 is a diagram illustrating an amplifier incorporating an alternative variable impedance transformer connected between the amplifier's combiner node and a load. By adjusting the impedance of impedance transformer 800, it is possible to vary the impedance at the amplifier's combiner node 28 and thereby control the operation of carrier amplifier 20.

Impedance transformer 800 includes a number of lengths of transmission line 802a, 802b, . . . 802n. Transmission line 802 is connected to combiner node 28 of amplifier 806 to load 804. In general, at any instant or back-off level the combination of the transmission line 802, having a specific length, with capacitors $C_1, C_2 \ldots$ or $C_n$ and the corresponding varactor diodes $D_1, D_2 \ldots$ or $D_n$ will deliver the preferred impedance for when the amplifier is operating at output power levels below the amplifier's back-off level.

As shown in FIG. 8, a number of additional capacitors ($C_1, C_2, \ldots C_n$) are connected between transmission line 802 and low (e.g., ground) voltage terminals through a number of varactor diodes ($D_1, D_2, \ldots D_n$). Each one of diodes $D_1, D_2, \ldots D_n$, are connected to controller 808, which is configured to set a voltage ($V_1, V_2, V_n$) across each of diodes $D_1, D_2, \ldots D_n$. The capacitance of each of diodes $D_1, D_2, \ldots D_n$ is configured to vary based upon the voltage $V_1, V_2, \ldots V_n$ across each one of diodes $D_1, D_2, \ldots D_n$. As the capacitance of each of diodes $D_1, D_2, \ldots D_n$ varies based upon the voltage across each diode, difference capacitances can be selectively connected to transmission line 802, thereby modifying the impedance of transmission line 802.

Since the relationship between the desired combiner node impedance RO and back-off level is known, as discussed above, controller 808 may be configured to implement a look-up table to map the voltages V1 . . . Vn to particular back-off power levels. In one embodiment the diodes D1 . . . Dn can be configured to induce distinct capacitances such that same control voltage can be applied to all the diodes D1 . . . Dn. Alternately, the diodes could be similarly constructed, but controller 808 is configured to set appropriate (and potentially differing) voltages across each one of diodes D1 . . . Dn according to a predefined function and/or algorithm to achieve a desired impedance.

During operation of the amplifier, controller 808 monitors the output power of the connected amplifier. This may be achieved, as discussed above, by monitoring the input signal to amplifier 800. Depending upon a magnitude of that output power, controller 808 supplies an appropriate control signal to each one of diodes D1 . . . Dn. In this manner, the impedance of impedance transformer 800 can be adjusted or modulated based upon the output power level of the amplifier.

The approaches described herein can allow for a more efficient operation of a Doherty amplifier incorporating both a carrier amplifier and a peaking amplifier. In conventional devices, attempts to achieve comparable efficiency improvements are sometimes made utilizing N-way Doherty amplifiers that incorporate two or more peaking amplifiers. In such a device, the multiple peaking amplifiers turn on at different back-off levels allowing the carrier amplifier to saturate at different power levels, thereby delivering improved efficiency. However, these three-or-more-path devices are difficult to design and manufacture due to the high potential of manufacturing variations between peaking amplifiers, making it practically difficult to implement two or more identical Peaking stages in N-way Doherty design.

An embodiment of a device includes a Doherty amplifier having a carrier path and a peaking path. The Doherty amplifier includes a carrier amplifier configured to amplify a signal received from the carrier path and a peaking amplifier configured to amplify a signal received from the peaking path. The device includes a variable impedance coupled to an output of the Doherty amplifier, and a controller configured to set the variable impedance to a first impedance when an output power level of the Doherty amplifier is less than a threshold and to a second impedance when the output power level of the Doherty amplifier is above the threshold.

An embodiment of a device includes an amplifier having a first path and a second path, and a variable impedance coupled to an output of the amplifier. The device includes a controller configured to set an impedance value of the variable impedance based upon an output power level of the amplifier.

An embodiment of a method of operating an amplifier includes determining a power level of the amplifier. The amplifier includes a variable impedance coupled to an output of the amplifier. The method includes comparing the power level of the amplifier to a threshold. When the power level is less than the threshold, the method includes setting the variable impedance to a first impedance. When the power level is greater than the threshold, the method includes setting the variable impedance to a second impedance.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
    a Doherty amplifier having a carrier path and a peaking path, the Doherty amplifier including a carrier amplifier configured to amplify a signal received from the carrier path and a peaking amplifier configured to amplify a signal received from the peaking path;
    an impedance inverter coupled between the carrier amplifier and a combiner node of the Doherty amplifier;
    a variable impedance including a first terminal coupled to an output of the Doherty amplifier and a second terminal configured to couple to a load, the variable impedance including an impedance transformer, the impedance transformer including:
        a plurality of lengths of transmission line,
        a plurality of capacitors, and
        a plurality of switches, each switch in the plurality of switches being configured to selectively couple one capacitor of the plurality of capacitors to one length of transmission line of the plurality of lengths of transmission line; and
    a controller configured to control one or more of the plurality of switches to set the variable impedance to an impedance to satisfy the expression $Po/Pmax = 20 \log(R0/Z0)$, where Po is an output power level of the Doherty amplifier, Pmax is a maximum output power level of the Doherty amplifier, R0 is the impedance of the transmission line, and Z0 is a characteristic impedance of the impedance inverter.

2. The device of claim 1, wherein the controller is coupled to an input of the Doherty amplifier.

3. The device of claim 1, wherein the controller is configured to measure a magnitude of an envelope of an input signal to the Doherty amplifier.

4. A device, comprising:
    an amplifier having a first path and a second path;
    an impedance inverter coupled to the first path and a combiner node of the amplifier;
    a variable impedance including a first terminal coupled to the combiner node and a second terminal configured to couple to a load; and
    a controller configured to set an impedance value of the variable impedance satisfy the expression $Po/Pmax = 20 \log(R0/Z0)$, where Po is an output power level of the amplifier, Pmax is a maximum output power level of the amplifier, R0 is the impedance of the variable impedance, and Z0 is a characteristic impedance of the impedance inverter.

5. The device of claim 4, wherein the variable impedance includes an impedance transformer.

6. The device of claim 5, wherein the impedance transformer is coupled to a load.

7. The device of claim 5, wherein the impedance transformer includes:
    a transmission line;
    at least one capacitor connected to the transmission line;
    at least one switch connected to the at least one capacitor; and
    wherein the controller is configured to control the switch to adjust the impedance of the impedance transformer.

8. The device of claim 5, wherein the impedance transformer includes:
 a transmission line; and
 a plurality of diodes connected to the transmission line, wherein the controller is connected to the plurality of diodes.

9. The device of claim 4, wherein the controller is coupled to an input of the amplifier.

10. The device of claim 4, wherein the controller is configured to measure a magnitude of an envelope of an input signal to the amplifier.

11. A method of operating an amplifier, comprising:
 determining an output power level of the amplifier, the amplifier including a first path and a second path, a variable impedance coupled to an output of the amplifier, and an impedance inverter coupled between the first path and the output of the amplifier;
 determining a maximum output power level of the amplifier; and
 setting an impedance of the variable impedance to satisfy the expression $Po/Pmax = 20 \log(R0/Z0)$, where Po is the output power level of the amplifier, Pmax is the maximum output power level of the amplifier, R0 is the impedance of the variable impedance, and Z0 is a characteristic impedance of the impedance inverter.

12. The method of claim 11, wherein determining the output power level of the amplifier includes detecting an input signal to the amplifier.

13. The method of claim 11, wherein determining the output power level of the amplifier includes detecting an output signal from the amplifier.

14. The method of claim 11, wherein the variable impedance includes an impedance transformer.

\* \* \* \* \*